United States Patent
Cho et al.

(10) Patent No.: US 6,444,522 B1
(45) Date of Patent: Sep. 3, 2002

(54) METHOD OF MANUFACTURING A FLASH MEMORY DEVICE WITH AN ANTIDIFFUSION REGION BETWEEN WELL REGIONS

(75) Inventors: Byung Hee Cho; Noh Yeal Kwak, both of Ichon (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/716,416

(22) Filed: Nov. 21, 2000

(30) Foreign Application Priority Data

Dec. 28, 1999 (KR) .............................................. 99-63906

(51) Int. Cl.[7] ......................................... H01L 21/8247
(52) U.S. Cl. ...................... 438/257; 438/420; 438/528; 438/545
(58) Field of Search ................................. 438/257, 264, 438/407, 414, 418, 419, 420, 528, 530, 545, 546

(56) References Cited

U.S. PATENT DOCUMENTS

| | | | | |
|---|---|---|---|---|
| 5,548,143 A | * | 8/1996 | Lee | 438/291 |
| 6,025,238 A | * | 2/2000 | Gardner | 438/528 |
| 6,221,724 B1 | * | 4/2001 | Yu et al. | 438/528 |
| 6,225,151 B1 | * | 5/2001 | Gardner et al. | 438/407 |

* cited by examiner

Primary Examiner—Chandra Chaudhari
(74) Attorney, Agent, or Firm—Pennie & Edmonds LLP

(57) ABSTRACT

There is disclosed a method of manufacturing a flash memory device. In order to solve the problems that a break down voltage between wells is reduced and an insulating characteristic between the wells is lowered due to degraded barrier characteristic between the wells, in a flash memory device employing a triple well structure, the present invention forms an anti-diffusion region for preventing diffusion of dopants between a P-well region and a N-well region by nitrogen ion implantation, thus improving the electrical characteristic of the device.

22 Claims, 3 Drawing Sheets

FIG. 2
(PRIOR ART)
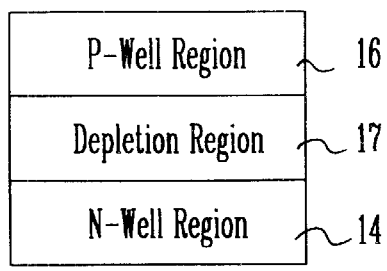
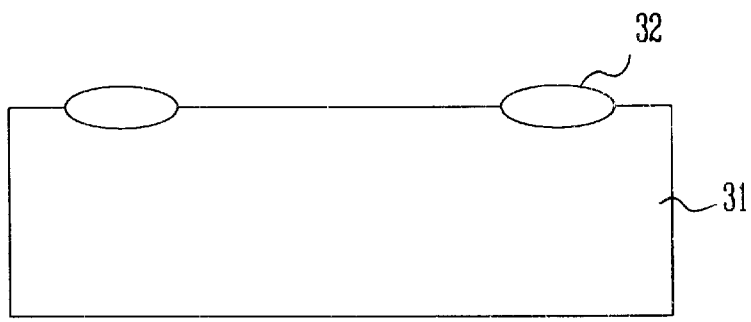
FIG. 3A
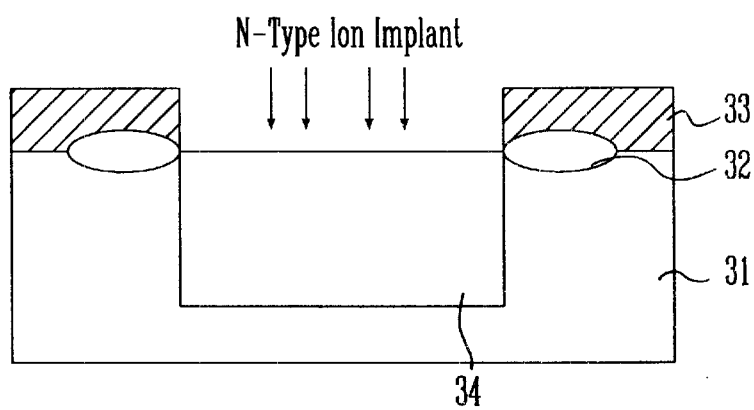
FIG. 3B
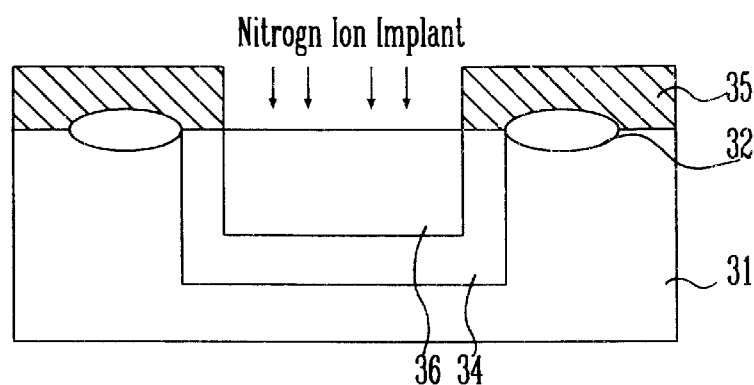
FIG. 3C

METHOD OF MANUFACTURING A FLASH MEMORY DEVICE WITH AN ANTIDIFFUSION REGION BETWEEN WELL REGIONS

FIELD OF THE INVENTION

The invention relates generally to a method of manufacturing a flash memory device. More particularly, the present invention relates to a method of manufacturing a flash memory device capable of improving a barrier characteristic between a substrate and a well in the flash memory device.

BACKGROUND OF THE INVENTION

In general, a well region in a flash memory device is formed through the process by which ions are implanted into a semiconductor substrate and the implanted ions are then diffused by thermal process, which usually employs a triple well structure. Then, a method of manufacturing a flash memory device will be below explained by reference to FIGS. 1A to 1D.

FIGS. 1A to 1D are cross-sectional views of a device for explaining a method of manufacturing a conventional flash memory device.

As shown in FIG. 1A, field oxide films 12 are formed on a semiconductor substrate 11 by device isolation process. The semiconductor substrate 11 employs a P-type substrate.

Then, as shown in FIG. 1B, a first photoresist pattern 13, through which a portion of the P-type semiconductor substrate 11 in which a N-well region will be formed is exposed, is formed. Next, N-type impurity ions such as phosphorous (P) are implanted to form a N-well region 14.

Thereafter, as shown in FIG. 1C, after the first photoresist pattern 13 is removed, a second photoresist pattern 15, through which a portion of the P-type semiconductor substrate 11 in which a P-well region will be formed is exposed, is formed. Next, P-type impurity ions such as boron (B) are implanted to form a P-well region 16.

FIG. 1D shows a state in which a thermal process is performed, by which dopants in each of the N-well region 14 and the P-well region 16 have an electrical characteristic and regions non-crystallized by ion implantation are crystallized.

The triple well structure formed by this method is shown in FIG. 2.

FIG. 2 is a diagram for explaining a well structure of a conventional flash memory device, which shows that a depletion region 17 is located between the N-well region 14 and the P-well region 16.

In this triple well structure, however, as the mobility of boron (B) used as a dopant for forming the P-well region is higher than that of phosphorous (P) used as a dopant for forming the N-well region, the concentration of boron (B) must be higher upon ion implantation into the P-well region, considering reduction in the concentration due to compensation of coexisting phosphorous (P) and boron (B) when a subsequent thermal process is performed. However, as the dopant concentration in the N-well region is reduced by a count doping phenomenon of phosphorous (P) and boron (B) generated when a subsequent thermal process is performed, the concentration in the N-well region must be increased because a barrier function of the N-well region is weakened between the P-type semiconductor substrate and the P-well region. If this is done, however, as the concentration of the P-well region and the N-well region is reduced, there is a problem that the electric characteristic of the device is degraded such as reduction in the break down voltage between the wells, reduction in the insulating characteristic between the wells, etc.

SUMMARY OF THE INVENTION

It is therefore an object of the present invention to provide a method of manufacturing a flash memory device which can improve a barrier characteristic between a substrate and well regions by forming an anti-diffusion region between the well regions.

In order to accomplish the above object, a method of manufacturing a flash memory device according to the present invention is characterized in that it comprises the steps of forming a semiconductor substrate in which field oxide films are formed, forming a first photoresist pattern through which a portion of the semiconductor substrate in which a first well region will be formed is exposed, on the semiconductor substrate, and then implanting an impurity ion having an opposite type to the semiconductor substrate to form a first well region, after removing the first photoresist pattern, forming a second photoresist pattern through which a portion of the semiconductor substrate in which a second well region will be formed is exposed on the semiconductor substrate, and then implanting ion implantation process to form an anti-diffusion region, implanting an impurity ion of the same type to the semiconductor substrate into the semiconductor substrate in which the second photoresist pattern is formed, thus forming a second well region, and performing a thermal process for activating impurities in the first well region, the anti-diffusion region and the second well region.

BRIEF DESCRIPTION OF THE DRAWINGS

The aforementioned aspects and other features of the present invention will be explained in the following description, wherein:

FIG. 2 is a diagram for explaining a well structure of a conventional flash memory device;

FIGS. 3A to 3E are cross-sectional views of a device for explaining a method of manufacturing a flash memory device according to the present invention.

DETAILED DESCRIPTION OF PREFERRED EMBODIMENTS

Figure 1A:
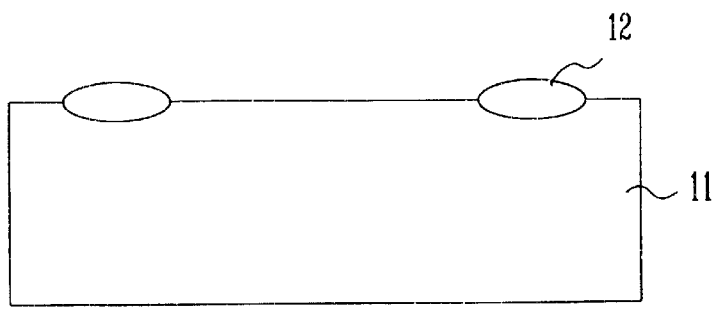
FIGS. 1A to 1D are cross-sectional views of a device for explaining a method of manufacturing a conventional flash memory device.
Figure 1B:
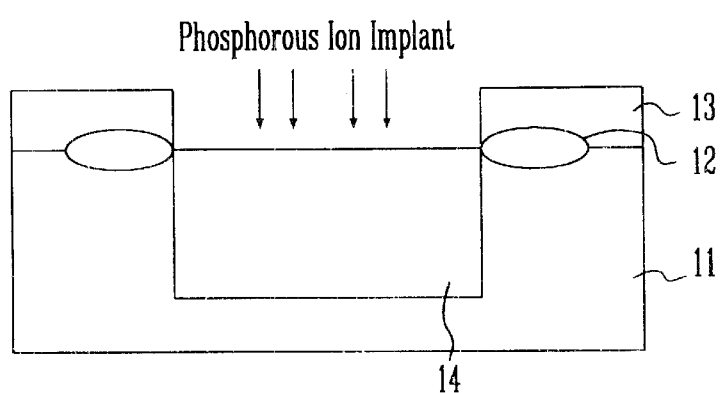
Figure 1C:
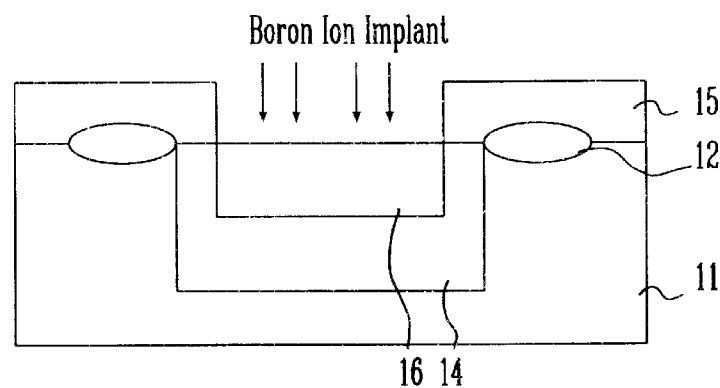
Figure 1D:
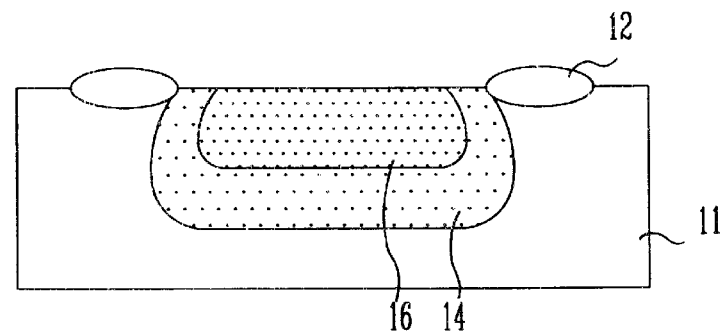

The present invention will be described in detail by way of a preferred embodiment with reference to accompanying drawings.

As shown in FIG. 3A, field oxide films 32 are formed on a semiconductor substrate 31 by device isolation process. The semiconductor substrate 31 employs, for example, a P-type substrate.

Next, as shown in FIG. 3B, a first photoresist pattern 33, through which a portion of the semiconductor substrate 31 of a P-type in which a first well region to be doped with an opposite type to the semiconductor substrate 31, that is, a N-well region will be formed is exposed, is formed. Then, a N-type impurity ion such as phosphorous (P), arsenic (As), etc. is implanted to form a N-well region 34. Upon ion implantation process for forming the N-well region 34, the ion implantation energy is 1~3MeV, the concentration of ions is 1E13~5E13 dyne/cm$^2$ and ions are implanted vertically to the semiconductor substrate 31

As shown in FIG. 3C, after the first photoresist pattern 33 is removed, a second photoresist pattern 35, through which the semiconductor substrate 31 of a P-type in which an anti-diffusion region will be formed is exposed, is formed. Thereafter, nitrogen ion are implanted with the concentration of 5E12~3E13 dyne/cm$^2$ by ion implantation energy of 0.5~1.4 MeV, thus forming an anti-diffusion region 36.

If nitrogen is used to form the anti-diffusion region 36, it effectively functions as an anti-diffusion layer between the P-well region 34 and a N-well region to be formed by a subsequent process, while not affecting the electric characteristic of the well. Due to this, upon a subsequent thermal process of boron (B) and phosphorous (P), reduction of the net concentration in the P-well and N-well regions caused by neutralization due to counting doping by dopant diffusion, can be prevented.

Also, when nitrogen ions are implanted, defects are generated due to ion implantation damages caused by silicon crystals within the semiconductor substrate 31 and many amorphous layers are thus formed. This prevents a channeling effect generated upon a subsequent ion implantation process and allows a further thin P-well region to be formed by increase of a gathering effect with the same ion implantation energy.

Figure 3D:
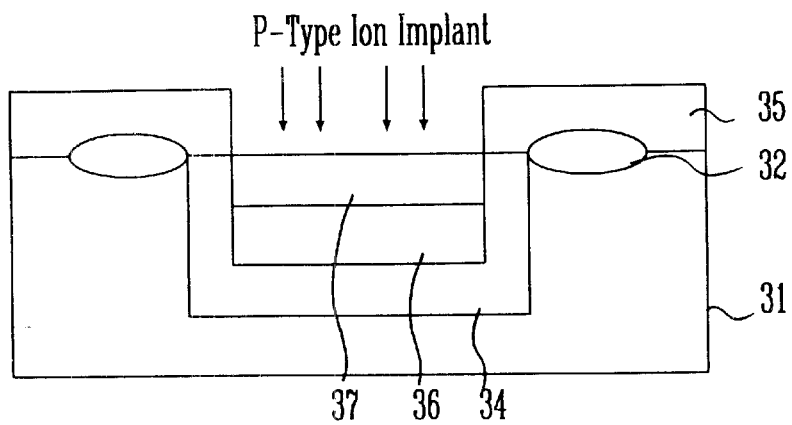

As shown in FIG. 3D, in order to form a second well region doped with the same type to the semiconductor substrate 31, for example, a P-type, that is, a P-well region, an impurity ion of a P-type such as boron (B) is implanted, with the second photoresist pattern 35 not being removed. At this time, upon the ion implantation process for forming the P-well region 37, the ion implantation energy is 0.3~1 Mev and the ion implantation concentration is 1E13~5E13 dyne/cm$^2$.

Figure 3E:
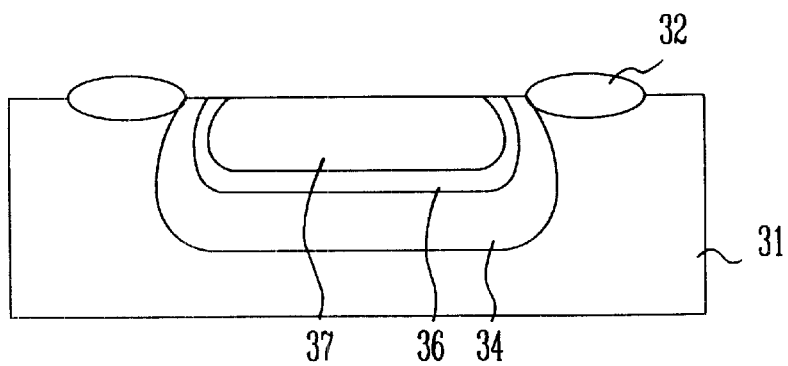

FIG. 3e shows a state in which a thermal process is performed, by which dopants in each of the N-well region 34, the anti-diffusion region 36 and the P-well region 37 have an electrical characteristic and regions non-crystallized by ion implantation process are crystallized. At this time, the thermal process is performed by a furnace annealing process at the temperature of 850° C.~1050° C. for 10 minutes ~1 hour.

Figure 4:
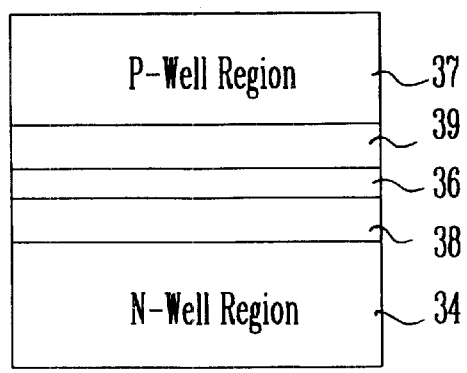
FIG. 4 is a diagram for explaining a well structure of a flash memory device according to the present invention.

FIG. 4 is a diagram for explaining the well structure of the flash memory device according to the present invention.

As shown, a first depletion region 38, an anti-diffusion region 36 and a second depletion region 39 are located between the N-well region 34 and the P-well region 37.

As such, as the anti-diffusion region 36 is inserted between the P-well region and the N-well region, the width of the depletion region is increased and the break down voltage is thus increased. Also, the anti-diffusion region 36 inserted between the P-well region and the N-well region reduces the leak current flowing between the P-well region and the N-well region.

As mentioned above, the present invention can prohibit reduction in the doping concentration of ions remained in respective wells since a count doping phenomenon is prevented by the anti-diffusion region formed between the P-well region and the N-well region prevents. Also, it can reduce a channel effect existing upon ion implantation into the P-well region, by defects in silicon crystals formed upon ion implantation process for forming the anti-diffusion region. In addition, it can effectively form a further thinner well region compared to the conventional method, by a gathering effect upon a subsequent thermal process. Further, the present invention can increase the break down voltage because between-well depletion regions are increased by the electrically neutralized property of the anti-diffusion region. Also, it can reduce the leak current because the neutralized layer exists between the P-well region and the N-well region.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising the steps of:

forming a semiconductor substrate in which field oxide films are formed;

forming a first photoresist pattern through which a portion of said semiconductor substrate in which a first well region will be formed is exposed, on said semiconductor substrate, and then implanting an impurity ion having an opposite type to said semiconductor substrate to form a first well region;

after removing said first photoresist pattern, forming a second photoresist pattern through which a portion of said semiconductor substrate in which a second well region will be formed is exposed on said semiconductor substrate, and then implanting ions with an ion implantation process to form an anti-diffusion region;

implanting an impurity ion of the same type as said semiconductor substrate, into said semiconductor substrate in which said second photoresist pattern is formed, thus forming a second well region; and performing a thermal process for activating impurities in said first well region, said anti-diffusion region and said second well region, thereby forming a triple-well structure having an anti-diffusion region separating said first and second well regions.

2. The method of manufacturing a flash memory device according to claim 1, wherein said semiconductor substrate is a P-type.

3. The method of manufacturing a flash memory device according to claim 1, wherein said first well is a N-well region into which N-type impurity ions are implanted.

4. The method of manufacturing a flash memory device according to claim 1, wherein the ion implantation process for forming said first well region is performed under the condition that the ion implantation energy is 1 to 3 MeV, the concentration of ions is 1E13 to 5E13 dyne/cm$^2$ and ions are vertically implanted to said semiconductor substrate.

5. The method of manufacturing a flash memory device according to claim 1, wherein said anti-diffusion region is formed by implanting nitrogen ion.

6. The method of manufacturing a flash memory device according to claim 5, wherein the nitrogen ions have an ion implantation energy of 0.5 to 1.4 MeV at the concentration of 5E12 to 3E13 dyne/cm$^2$.

7. The method of manufacturing a flash memory device according to claim 1, wherein said second well region is formed by implanting impurity ions of a P-type.

8. The method of manufacturing a flash memory device according to claim 7, wherein boron ions are implanted and the second well region is formed with the ion implantation energy of 0.3 to 1 Mev and at the ion implantation concentration is 1E13 to 5E13 dyne/cm$^2$.

9. The method of manufacturing a flash memory device according to claim 1, wherein said thermal process is performed by furnace annealing process at the temperature of 850° C. to 1050° C. for 10 minutes to 1 hour.

10. A method of manufacturing a flash memory device, comprising the steps of:

provided a semiconductor substrate of a first type;

forming a pair of spaced apart field oxides on the semiconductor substrate to thereby define a first region therebetween;

forming a first photoresist pattern above the semiconductor substrate such that said first region is exposed;

implanting a first ion in said first region to thereby form a first well region, the first ion being of a second type with a polarity opposite to a polarity of said first type;

forming a second photoresist pattern above the semiconductor substrate such that at least a portion of said first region is exposed;

implanting a second ion in said portion to form an anti-diffusion region above the first well region;

implanting a third ion in said portion to thereby form a second well region, the third ion being of said first type; and performing a thermal process for activating impurities in said first well region, said anti-diffusion region and said second well region, thereby forming a triple-well structure having an anti-diffusion region separating said first and second well regions.

11. The method of manufacturing a flash memory device according to claim 10, wherein said semiconductor substrate is a P-type.

12. The method of manufacturing a flash memory device according to claim 11, wherein said first well is a N-well region into which N-type impurity ions are implanted.

13. The method of manufacturing a flash memory device according to claim 12, wherein the ion implantation process for forming said first well region is performed under the condition that the ion implantation energy is 1 to 3 MeV, the concentration of ions is 1E13 to 5E13 dyne/cm$^2$ and ions are vertically implanted to said semiconductor substrate.

14. The method of manufacturing a flash memory device according to claim 12, wherein said anti-diffusion region is formed by implanting nitrogen ions.

15. The method of manufacturing a flash memory device according to claim 14, wherein the nitrogen ions have an ion implantation energy of 0.5 to 1.4 MeV at the concentration of 5E12 to 3E13 dyne/cm$^2$.

16. The method of manufacturing a flash memory device according to claim 14, wherein said second well region is formed by implanting impurity ions of a P-type.

17. The method of manufacturing a flash memory device according to claim 17, wherein boron ions are implanted and the second well region is formed with the ion implantation energy of 0.3 to 1 Mev and at the ion implantation concentration is 1E13 to 5E13 dyne/cm$^2$.

18. The method of manufacturing a flash memory device according to claim 10 wherein said thermal process is performed by furnace annealing process at the temperature of 850° C. to 1050° C. for 10 minutes to 1 hour.

19. The method of manufacturing a flash memory device according to claim 1, wherein:

the first photoresist pattern is different in size from the second photoresist pattern; and implanting ions with an ion implantation process to form an anti-diffusion region, and implanting an impurity ion of the same type as said semiconductor substrate, are both performed using the second photoresist pattern.

20. The method of manufacturing a flash memory device according to claim 10, wherein:

the first photoresist pattern is different in size from the second photoresist pattern; and said steps of implanting a second ion and implanting a third ion are both performed using the second photoresist pattern.

21. A method of manufacturing a flash memory device, comprising the steps of:

forming a semiconductor substrate in which field oxide films are formed;

forming a first photoresist pattern through which a portion of said semiconductor substrate in which a first well region will be formed is exposed, on said semiconductor substrate, and then implanting an impurity ion having an opposite type to said semiconductor substrate to form a first well region;

after removing said first photoresist pattern, forming a second photoresist pattern through which a portion of said semiconductor substrate in which a second well region will be formed is exposed on said semiconductor substrate, and then implanting ions with an ion implantation process to form an anti-diffusion region;

implanting an impurity ion of the same type as said semiconductor substrate, into said semiconductor substrate in which said second photoresist pattern is formed, thus forming a second well region; and performing a thermal process for activating impurities in said first well region, said anti-diffusion region and said second well region, wherein:

the first photoresist pattern is different in size from the second photoresist pattern; and implanting ions with an ion implantation process to form an anti-diffusion region, and implanting an impurity ion of the same type as said semiconductor substrate, are both performed using the second photoresist pattern.

22. A method of manufacturing a flash memory device, comprising the steps of:

providing a semiconductor substrate of a first type;

forming a pair of spaced apart field oxides on the semiconductor substrate to thereby define a first region therebetween;

forming a first photoresist pattern above the semiconductor substrate such that said first region is exposed;

implanting a first ion in said first region to thereby form a first well region, the first ion being of a second type with a polarity opposite to a polarity of said first type;

forming a second photoresist pattern above the semiconductor substrate such that at least a portion of said first region is exposed;

implanting a second ion in said portion to form an anti-diffusion region above the first well region;

implanting a third ion in said portion to thereby form a second well region, the third ion being of said first type; and performing a thermal process for activating impurities in said first well region, said anti-diffusion region and said second well region, wherein:

the first photoresist pattern is different in size from the second photoresist pattern; and said steps of implanting a second ion and implanting a third ion are both performed using the second photoresist pattern.

* * * * *